United States Patent
Burnham et al.

(10) Patent No.: US 6,909,157 B2
(45) Date of Patent: Jun. 21, 2005

(54) THERMAL NITROGEN DISTRIBUTION METHOD TO IMPROVE UNIFORMITY OF HIGHLY DOPED ULTRA-THIN GATE CAPACITORS

(75) Inventors: Jay S. Burnham, East Fairfield, VT (US); James S. Nakos, Essex Junction, VT (US); James J. Quinlivan, Essex Junction, VT (US); Steven M. Shank, Jericho, VT (US); Deborah A. Tucker, Westford, VT (US); Beth A. Ward, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 37 days.

(21) Appl. No.: 10/652,307

(22) Filed: Sep. 2, 2003

(65) Prior Publication Data

US 2005/0040480 A1 Feb. 24, 2005

Related U.S. Application Data

(62) Division of application No. 10/206,427, filed on Jul. 26, 2002, now Pat. No. 6,706,644.

(51) Int. Cl.$^7$ .............................................. H01L 29/76
(52) U.S. Cl. ...................................... 257/411; 257/655
(58) Field of Search ................................. 257/411, 655

(56) References Cited

U.S. PATENT DOCUMENTS

| | | | |
|---|---|---|---|
| 4,762,728 A | 8/1988 | Keyser et al. | 427/38 |
| 5,840,610 A | 11/1998 | Gilmer et al. | 438/301 |
| 5,861,651 A | 1/1999 | Brasen et al. | 257/411 |
| 5,880,040 A | 3/1999 | Sun et al. | 438/769 |
| 5,939,763 A | 8/1999 | Hao et al. | 257/411 |
| 6,017,791 A | 1/2000 | Wang et al. | 438/253 |
| 6,706,644 B2 * | 3/2004 | Burnham et al. | 438/775 |
| 2002/0009900 A1 | 1/2002 | Tay et al. | 438/786 |

* cited by examiner

*Primary Examiner*—Mark V. Prenty
(74) *Attorney, Agent, or Firm*—Connolly Bove Lodge & Hutz LLP; William D. Sabo

(57) ABSTRACT

Methods such as Remote Plasma Nitridation (RPN) are used to introduce nitrogen into a gate dielectric layer. However, these methods yield nitrided layers where the layers are not uniform, both in cross-sectional profile and in nitrogen profile. Subjecting the nitrided layer to an additional NO anneal process increases the uniformity of the nitrided layer.

6 Claims, 3 Drawing Sheets

THERMAL NITROGEN DISTRIBUTION METHOD TO IMPROVE UNIFORMITY OF HIGHLY DOPED ULTRA-THIN GATE CAPACITORS

REFERENCE TO RELATED APPLICATION

This is a division of application Ser. No. 10/206,427, filed Jul. 26, 2002, now U.S. Pat. No. 6,706,644; issued Mar. 16, 2004.

FIELD OF INVENTION

The present invention relates to transistor design, and, in particular, a thermal nitrogen deposition method to improve the uniformity of the nitrided layer of a gate capacitor of a transistor.

BACKGROUND OF THE INVENTION

The speed requirements for high-performance 0.13 um CMOS devices has driven gate oxide thicknesses to less than 20 Å, with inversion and physical thicknesses trending to less than 20 Å. As the dielectric layers are scaled thinner, the leakage currents through these gates exponentially increase due to more direct tunneling of electrons and holes through the potential barriers of the dielectric. This can affect device properties by causing higher standby power consumption, reliability problems, and degradation of certain chip functions such as timing. Battery powered devices for mobile applications for example, have some of the strictest requirements for leakage current, where lower leakage currents produce longer battery life.

FIG. 1 shows a transistor structure with the gate dielectric (20). Gate leakage current is defined as the current from gate to drain when Vg (22) is less than the threshold voltage of the device. This current is an exponential function of thickness, with the current increasing by 2–3X for every 1 Å decrease in thickness, in the sub-20 Å thickness range for a gate dielectric layer that is formed using $SiO_2$.

Remote plasma nitridation (RPN) or decoupled plasma nitridation (DPN) are methods used to introduce large concentrations of nitrogen into the gate dielectric layer, thereby forming a silicon oxynitride gate dielectric. With the incorporation of nitrogen, the gate leakage current can by reduced. This is mainly due to increasing the capacitance of the layer which allows for larger physical thicknesses with the same electrical thickness. There is also some reduction in leakage current due to the change in chemical bonding at the dielectric-Si substrate interface. These particular processes are desirable due to their ability to incorporate large concentrations of nitrogen (>$4 \times 10^{21}$ at/$cm^3$) and their ability to control the profile of the nitrogen throughout the dielectric layer. These process techniques however, can be inherently non-uniform, thus causing a large non-uniformity of device parameters across the wafer. Non-uniformity of device parameters can cause severe yield degradation in chip performance if certain specifications are out of range. These electrical parameters can include leakage current, electrical thickness, threshold voltage, and device current. This invention addresses this non-uniformity, and demonstrates that the physical thickness and nitrogen concentration is improved by making use of the techniques described in the invention.

SUMMARY OF THE INVENTION

The present invention relates to a method for improving the uniformity of the nitrided layer that is formed over the base $SiO_2$ layer of a transistor gate dielectric, thus lowering the leakage current through the base $SiO_2$ layer.

DESCRIPTION OF THE PREFERRED EMBODIMENTS

Figure 1:
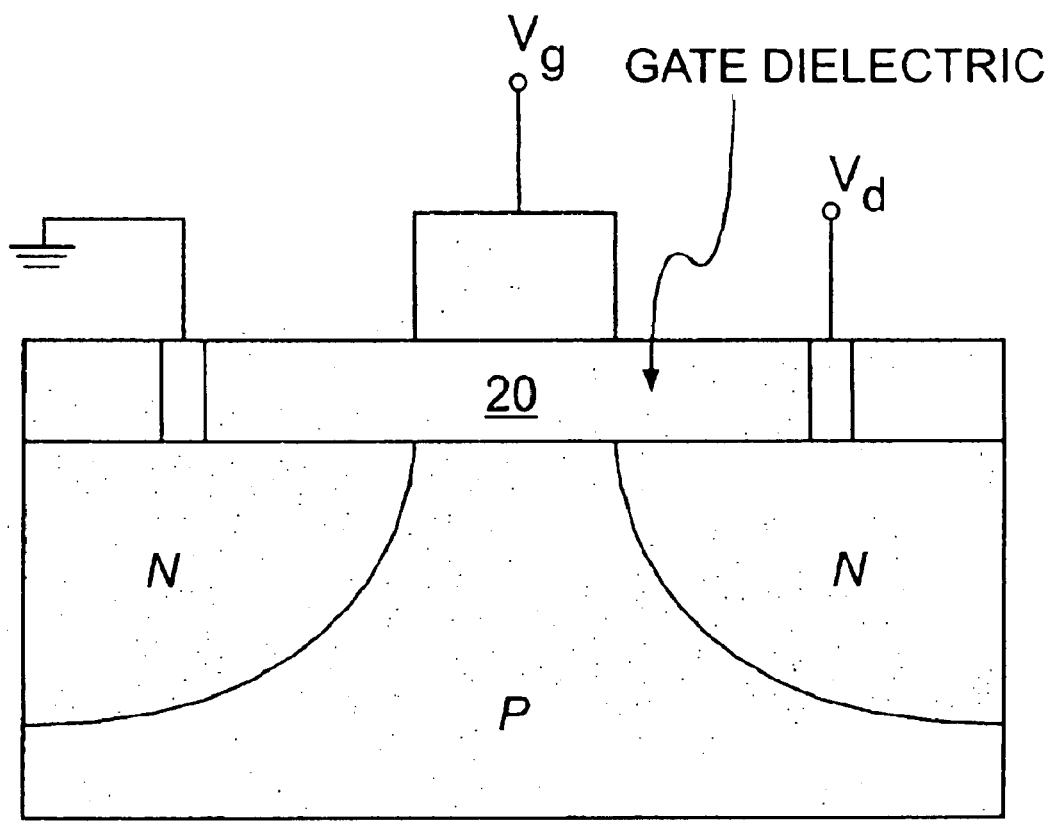
FIG. 1 shows a transistor used to define gate leakage current.
Figure 2:
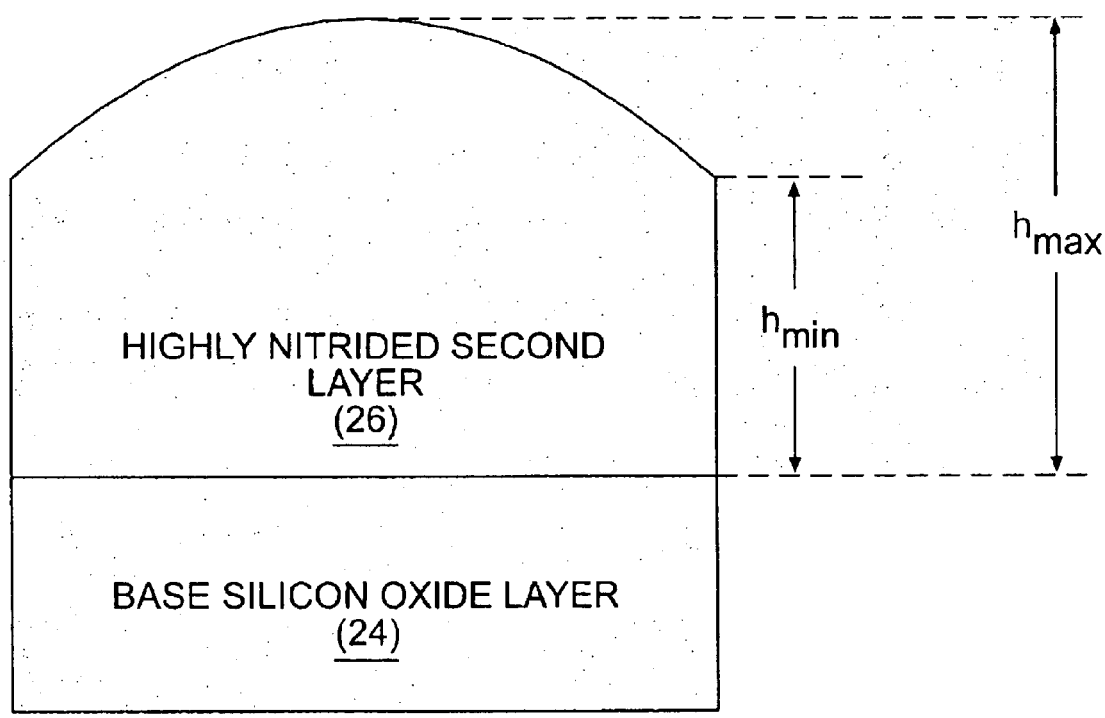
FIG. 2 shows the cross-sectional profile of a wafer, comprising the base oxide layer and the nitrided layer formed by any nitrogen-deposition process.

FIG. 2 shows the cross sectional profile of a wafer used as a gate dielectric. First a base oxide layer (24), for example, silicon dioxide ($SiO_2$), of the wafer is formed using known techniques, such as RTO or furnace oxidation. The base oxide layer can be between 5 Å and 20 Å thick. The base oxide layer is usually approximately 10 Å thick. Next, nitrogen is deposited in the base oxide layer using RPN or DPN, resulting in a highly-nitrided second layer (26) containing a high concentration of nitrogen. This highly-nitrided second layer can be anywhere between 10Å–30 Å thick. However, RPN and DPN result in this highly-nitrided second layer having a non-uniform physical profile. FIG. 2 shows the situation where the height of the second layer is greater in the middle than at the edges of the profile. FIG. 2 shows only this one irregular profile. Other irregular profiles, such as where, for example, the edges of the highly nitrided layer are higher than the middle of the highly nitrided layer are possible as well, are not shown. FIG. 2 defines $h_{max}$ as the highest point of the highly-nitrided second layer above the base oxide layer and $h_{min}$ as the lowest point of the highly-nitrided second layer above the base oxide layer.

In addition to RPN's and DPN's resulting in the non-uniform physical structure of this highly-nitrided second layer, RPN and DPN also results in a non-uniform deposition of nitrogen within the highly-nitrided second layer. For example, Table 2 shows nitrogen concentrations between the center and the edge of the highly-nitrided second layer differing by $3 \times 10^{14}$ atoms/$cm^3$.

Figure 3:
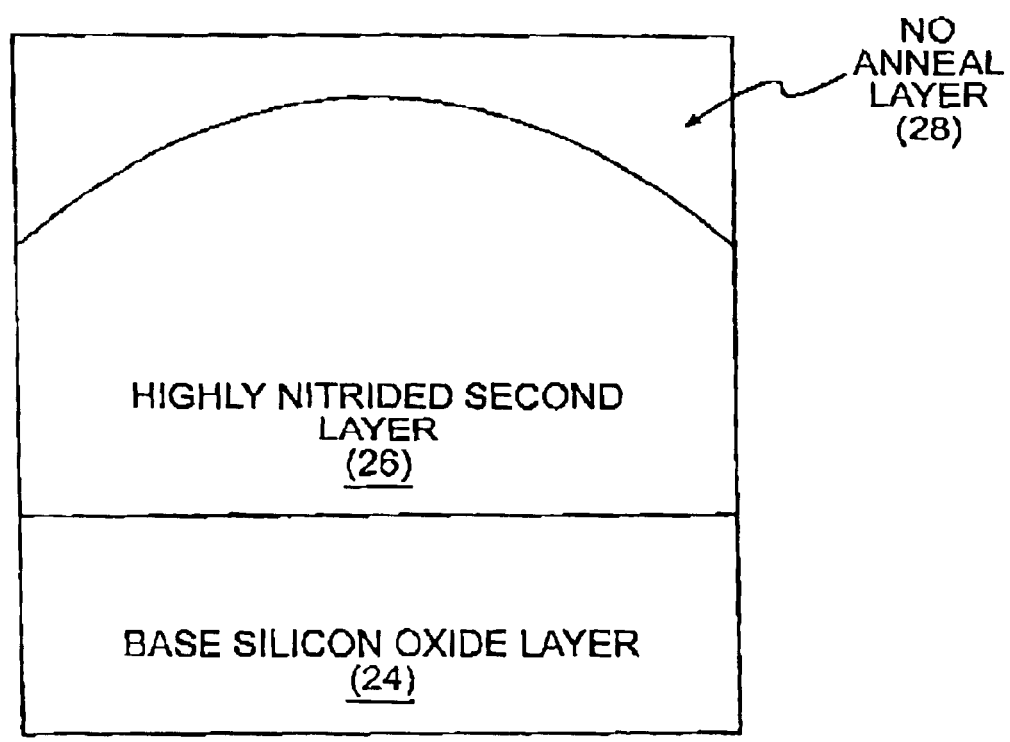
FIG. 3 shows the cross sectional profile of a wafer, comprising a first base oxide layer, a second nitrided layer formed by any nitrogen-deposition process, and a third NO annealed layer.

Subjecting this structure shown in FIG. 2 (i.e., a two-layer structure comprising a base oxide layer and a highly-nitrided second layer) to a nitric thermal anneal process reduces the non-uniformity of the profile of the highly-nitrided second layer, resulting in the cross-sectional profile shown in FIG. 3. The resulting structure has a base oxide layer (24), a highly nitrided second layer (26), and a NO (nitric oxide) anneal layer (28). The NO anneal layer can be between 1 Å and 30 Å thick, and is typically between 1 Å and 5 Å thick. Subjecting this structure shown in FIG. 2 to a nitric thermal anneal process also reduces the non-uniformity of nitrogen deposition concentration within the highly-nitrided second layer, as shown in Table 2. Two methods can be used to carry out this nitric thermal anneal.

In a first embodiment of the present invention, a plurality of wafers on which a base oxide layer and a highly-nitrided second layer have been formed are put into an annealing furnace. The time, temperature, and pressure of the annealing process can be varied to achieve the maximum uniformity of the nitric anneal layer. The wafers are exposed to a range of temperatures for times ranging from 5 minutes to 30 minutes. The temperatures to which the wafers are exposed can range between 500–1100 degrees Centigrade. The pressure to which the wafers are exposed during this process can range between 1–760 torr. During the time when the wafers are in the furnace exposed to the annealing temperature and pressure, gas is allowed to flow over the surface of the wafers. This gas can be any gas which under the temperature and pressure conditions under which the anneal is performed dissociates into NO. The gas is heated to a temperature in the range of 800–1100 degrees Centigrade before being admitted into the furnace and allowed to pass over the wafers. Preferably, the gas is heated to 950 degrees Centigrade before being admitted into the furnace and allowed to pass over the wafers.

In a second embodiment of the present invention, single wafer tools are used to perform the annealing process instead of an annealing furnace. In other words, while using the annealing furnace allows a batch of wafers to undergo thermal annealing at one time, in this embodiment, single wafers are subjected to the annealing process at one time. The time, temperature, and pressure parameters to which the wafers are exposed are the same as in the first embodiment described previously. The wafers are exposed to a range of temperatures for times ranging from 5 seconds to 30 minutes. The temperatures to which the wafers are exposed can range between 500–1100 degrees Centigrade. The pressure to which the wafers are exposed during this process can range between 1–760 torr. During the time when the wafers are exposed to the annealing temperature and pressure, gas is allowed to flow over the surface of the wafers. This gas can be any gas which under the temperature and pressure conditions under which the anneal is performed dissociates into NO. The gas is heated to a temperature in the range of 800–1200 degrees Centigrade before being allowed to pass over the wafers.

Preferably, the gas is heated to 950 degrees Centigrade before being allowed to pass over the wafers.

The advantage of the first embodiment discussed above is that several wafers can be annealed at once. The advantage of the second embodiment is that, in a single wafer process, the required temperature and pressure can be reached in a shorter period of time.

The following table (Table 1) shows the results obtained for two furnace annealing processes accomplished under the conditions shown. These data are obtained by optical measuring:

| Furnace Anneal for 13 minutes $N_2O$ 700 C (950C precombustion chamber temperature) Process/sequence | Elliptical thickness | Range | Std. Dev. | Furnace Anneal for 26 minutes $N_2O$ 800 C (950C precombustion chamber temperature) Elliptical Thickness | Range | Std. Dev. |
|---|---|---|---|---|---|---|
| RPN | 21.44 A | 2.24 A | 0.5 A | 21.34 A | 1.91A | 0.47A |
| RPN/Furnace anneal | 22.46 A | 1.38 A | 0.33 A | 24.17 A | 0.93 A | 0.28 A |
| RTO/RPN | 20.27 A | 1.53 A | 0.39 A | 20.04 A | 1.05 A | 0.27 A |
| RTO/RPN/Furnace Anneal | 23.04 A | 0.70 A | 0.18 A | 26.11 A | 0.98 A | 0.24 A |

Where: (a) elliptical thickness represents the thickness of the highly-nitrided layer after the various processes shown; and (b) range shows the difference between the highest and lowest points of the cross-sectional profile of the top of the highly-nitrided layer. All unit measurements shown are in angstroms. As the data above shows, the furnace annealing processes reduces the range; that is, the difference between the highest and lowest points on the cross-sectional profile of the top of the highly nitrided layer.

The following table (Table 2) shows data obtained from the furnace annealing process measured by secondary ion mass spectrometry.

| Process | Wafer site | Elliptical thickness | TOF-SIMS Thickness | SIMS N dose (e14 al/cm$^3$) | SIMS N concentration (e21 at/cm$^3$) |
|---|---|---|---|---|---|
| 1. RTO/RPN (no anneal) | Center | 20.14 A | 15.0 A | 9 | 4 |
| | Edge | 19.02 A | 17.0 A | 6 | 3 |
| | Mean | 19.65 A | | | |
| 2. RTO/RPN and Furnace 1 anneal | Center | 23.24 A | 20.0 A | 9 | 4 |
| | Edge | 22.29 A | 19.0 A | 8 | 4 |
| | Mean | 22.80 A | | | |
| 3. RTO/RPN and Furnace 2 anneal | Center | 26.25 A | 23.0 A | 8 | 3.5 |
| | Edge | 25.50 A | 23.0 A | 7 | 3.4 |
| | Mean | 25.79 A | | | |

Where physical elliptical uniformity is defined as 100*(max-min)/(2*mean), where max and min are the maximum height and minimum height, respectively, of the cross sectional profile of the highly nitrided layer, the processes listed above yielded the following data. Process 1 yielded a physical elliptical uniformity of 2.85%. Process 2 yielded a physical elliptical uniformity of 2.08%. Process 3 yielded a physical elliptical uniformity of 1.42%.

The table also shows the improvement in concentration uniformity gained by the annealing process. Process 1, in which no anneal was performed, yielded a dose uniformity of 67% and a concentration uniformity of 77%. By contrast, process 2 yielded a dose uniformity of 89% and a concentration uniformity of 100%. Process 3 yielded a dose uniformity of 88% and a concentration uniformity of 97%.

The Furnace 1 process is a furnace annealing process for 13 minutes $N_2O$ 700 C (950C precombustion chamber temperature). The Furnace 2 process is a furnace annealing process at 26 minutes $N_2O$ 800 C (950C precombustion chamber temperature).

The foregoing description encompasses only the preferred embodiments of the present invention. The following claims and their equivalents define the scope of the invention.

What is claimed is:

1. A gate dielectric for an integrated circuit device, comprising
    a base silicon oxide layer;
    a highly nitrided second layer, wherein said nitrided layer has a first percent elliptical uniformity and a first percent nitrogen concentration uniformity; and
    an NO annealed layer, wherein said annealed layer has a second percent elliptical uniformity less than said first percent elliptical uniformity, and a second percent nitrogen concentration uniformity higher than said first percent nitrogen concentration uniformity.

2. A gate dielectric for an integrated circuit device, according to claim 1, wherein each of said nitrided and said annealed layers have a nitrogen concentration of about $4 \times 10^{21}$ atoms/cm$^3$.

3. A gate dielectric for an integrated circuit device, according to claim 1, wherein the thickness of said silicon oxide layer is from about 5 Å to about 20 Å; the thickness of said nitrided layer is from about 10 Å to about 30 Å; and the thickness of said annealed layer is from about 1 Å to about 30 Å.

4. A gate dielectric for an integrated circuit device, according to claim 1, wherein said annealed layer has a physical elliptical uniformity of less than 2.10%.

5. A gate dielectric for an integrated circuit device, according to claim 1, wherein said annealed layer has a concentration uniformity of at least 96%.

6. A gate dielectric for an integrated circuit device, according to claim 1, wherein said annealed layer has a concentration uniformity of at least 97%.

* * * * *